(12) United States Patent
Guest et al.

(10) Patent No.: US 6,252,981 B1
(45) Date of Patent: Jun. 26, 2001

(54) SYSTEM AND METHOD FOR SELECTION OF A REFERENCE DIE

(75) Inventors: Clyde Maxwell Guest; Rajiv Roy, both of Plano; Charles Kenneth Harris, Dallas, all of TX (US)

(73) Assignee: Semiconductor Technologies & Instruments, Inc., Plano, TX (US)

( * ) Notice: Subject to any disclaimer, the term of this patent is extended or adjusted under 35 U.S.C. 154(b) by 0 days.

(21) Appl. No.: 09/270,607

(22) Filed: Mar. 17, 1999

(51) Int. Cl.$^7$ .............................. G06K 9/70; G06K 9/36
(52) U.S. Cl. ........................................ 382/149; 382/170
(58) Field of Search .......................... 382/145, 148, 382/149, 144, 168, 170, 146, 147, 150, 151, 152; 356/237.5, 237.4, 601, 613, 390; 438/16; 348/87, 126; 250/559.2, 559.39, 559.46; 700/110; 702/40, 159

(56) References Cited

U.S. PATENT DOCUMENTS

| | | | |
|---|---|---|---|
| 4,928,313 | * | 5/1990 | Leonard et al. ........................... 382/8 |
| 5,091,963 | * | 2/1992 | Litt et al. .................................. 382/8 |
| 5,513,275 | * | 4/1996 | Khalaj et al. ........................ 382/149 |
| 5,539,752 | * | 7/1996 | Berezin et al. ...................... 371/22.1 |
| 5,544,256 | * | 8/1996 | Brecher et al. ....................... 382/149 |
| 5,640,200 | * | 6/1997 | Michael .................................. 348/87 |
| 5,801,965 | * | 9/1998 | Takagi et al. ........................ 364/552 |
| 5,832,118 | * | 11/1998 | KIm ..................................... 382/224 |
| 5,943,437 | * | 8/1999 | Sumie et al. ......................... 382/149 |
| 6,021,214 | * | 2/2000 | Evans et al. ......................... 382/141 |
| 6,031,607 | * | 2/2000 | Miyazaki ........................... 356/237.1 |

* cited by examiner

*Primary Examiner*—Leo Boudreau
*Assistant Examiner*—Brian P. Werner
(74) *Attorney, Agent, or Firm*—Christopher J. Rourk; Akin, Gump, Strauss, Hauer & Feld, L.L.P.

(57) ABSTRACT

A system for selecting reference die images, such as for use with a visual die inspection system, is provided. The system includes a die image comparator, which compares a first die image to a second die image in order to create a difference image that contains only the differences between the two die images. The system also includes a difference image analysis system that receives data from the die image comparator. The difference image analysis system analyzes the difference image and determines whether there are any features of the difference image that indicate that either the first die image or the second die image should not be used as a reference die image.

26 Claims, 8 Drawing Sheets

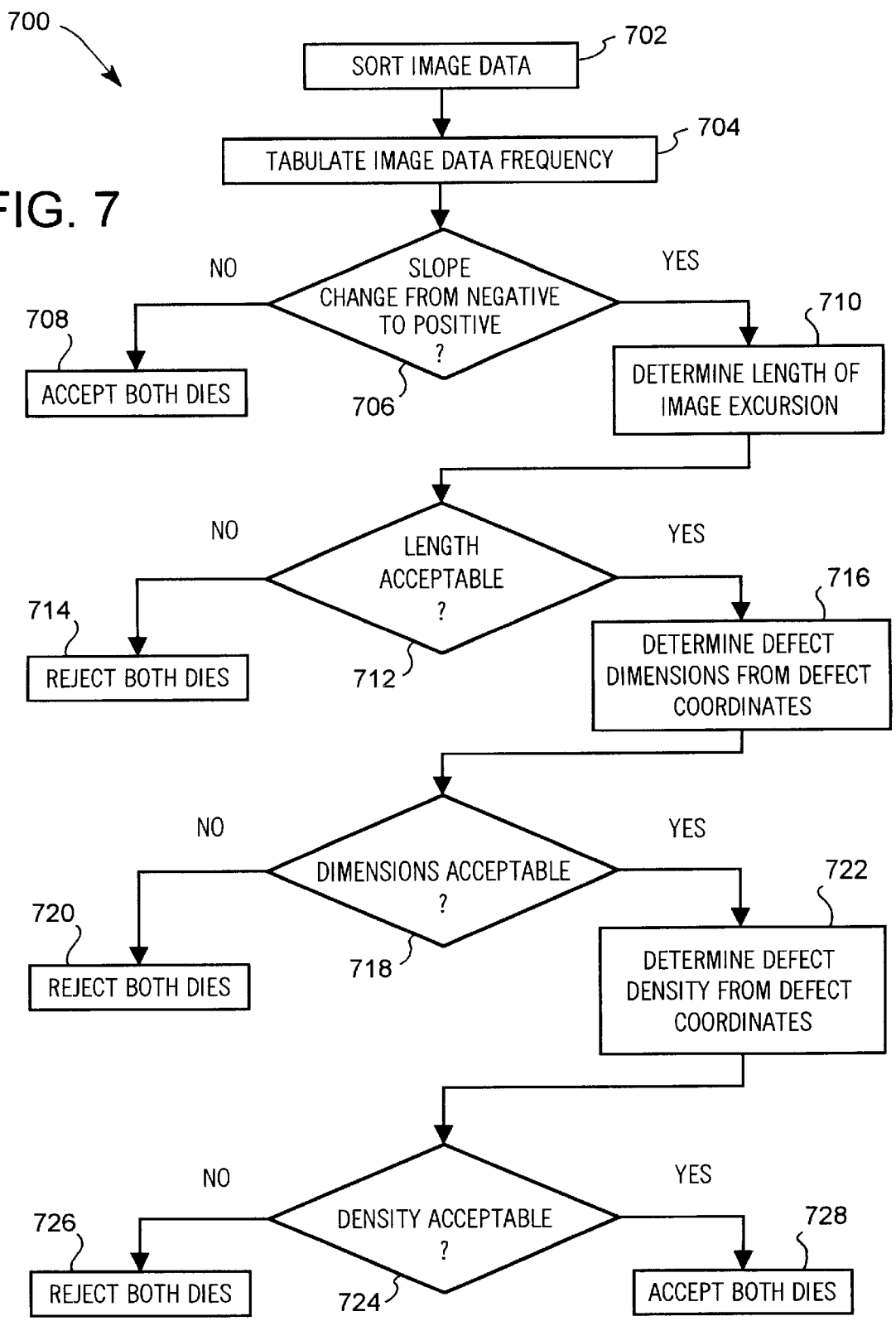

SYSTEM AND METHOD FOR SELECTION OF A REFERENCE DIE

FIELD OF THE INVENTION

The present invention pertains to die inspection systems, such as those used in the inspection of dies formed from semiconductor wafers, wherein the die inspection system selects dies that are formed from the wafer that are to be used to create a reference model for determining whether other dies that are formed from the wafer contain defects or flaws.

BACKGROUND

Semiconductor devices are typically manufactured from ingots of crystalline semiconductor materials that have been sliced into wafers having a predetermined thickness. These wafers are then cut into dies having predetermined dimensions, such as 0.5 cm. by 0.5 cm. The dies are then etched and oxidized using various chemicals and masks, such that predetermined circuits are created on the dies. Such processes are well known in the art.

During the manufacture of such devices, defects or flaws may be formed or inadvertently created on one or more dies before or after they have been cut from the wafer. Such defects or flaws will typically cause the device to misoperate. It is desirable to detect such defective or flawed dies before the dies are shipped to a customer. Although systems and methods have been implemented that may be used to detect defective or flawed dies, such systems and methods require an operator to set up each wafer, such as by selecting dies that are not defective that are then used to create a model. The model may then be compared with other dies of the wafer. The systems and methods then perform the comparison between the model die and each die of the silicon wafer, thus reducing the time required to check each die of the silicon wafer as compared with manual inspection of each die.

While such inspection systems have decreased the time and operator involvement that are required to inspect each die of a silicon wafer, operator setup of the inspection system now occupies a significant portion of the time required to inspect the dies. Accordingly, there has been a need for a system and method for detecting defective or flawed dies that does not require an operator to manually select model dies for each new wafer.

SUMMARY OF THE INVENTION

The present invention provides improved systems and methods for selecting multiple dies from one or more wafers of semiconducting material that have allowable levels of defects. These selected dies are then used to create a comparison reference to detect defective or flawed dies that have been formed on the wafer of semiconducting material.

In accordance with one aspect of the present invention, a system for selecting reference die images, such as for use with a visual die inspection system, is provided. The system includes a die image comparator, which compares a first die image to a second die image to create a difference image that contains only the differences between the two die images. The system also includes a difference image analysis system that receives data from the die image comparator. The difference image analysis system analyzes the difference image and determines whether there are any features of the difference image that indicate whether the first die image or the second die image should not be used as a reference die image.

In accordance with another aspect of the present invention, a system for inspecting dies is provided. The system includes a camera that is used to obtain images of one or more dies. A reference die detection system is connected to the camera. The reference die detection system determines whether a first die image and a second die image may be used as reference images.

Still further in accordance with the invention, there is provided a method for selecting a reference die image. The method includes subtracting a first die image from a second die image to create a difference image. For example, a numerical value associated with each picture element of the first die image may be subtracted from the numerical value associated with each corresponding picture element of the second die image in order to create the numerical value of each corresponding picture element of the difference image. It is then determined whether the difference image contains unacceptable data.

The die selection system of the present invention eliminates the need for an operator to manually view and select dies that will be used for comparison with other dies that have been formed on a wafer to determine whether such dies contain surface flaws or defects that are indicative of devices that will misoperate.

Those skilled in the art will further appreciate the advantages and superior features of the invention together with other important aspects thereof on reading the detailed description which follows in conjunction with the drawings.

BRIEF DESCRIPTION OF THE DRAWINGS

FIG. 7 is a flowchart of a method for analyzing other image data in accordance with an exemplary embodiment of the present invention.

DETAILED DESCRIPTION OF PREFERRED EMBODIMENTS

Figure 1:
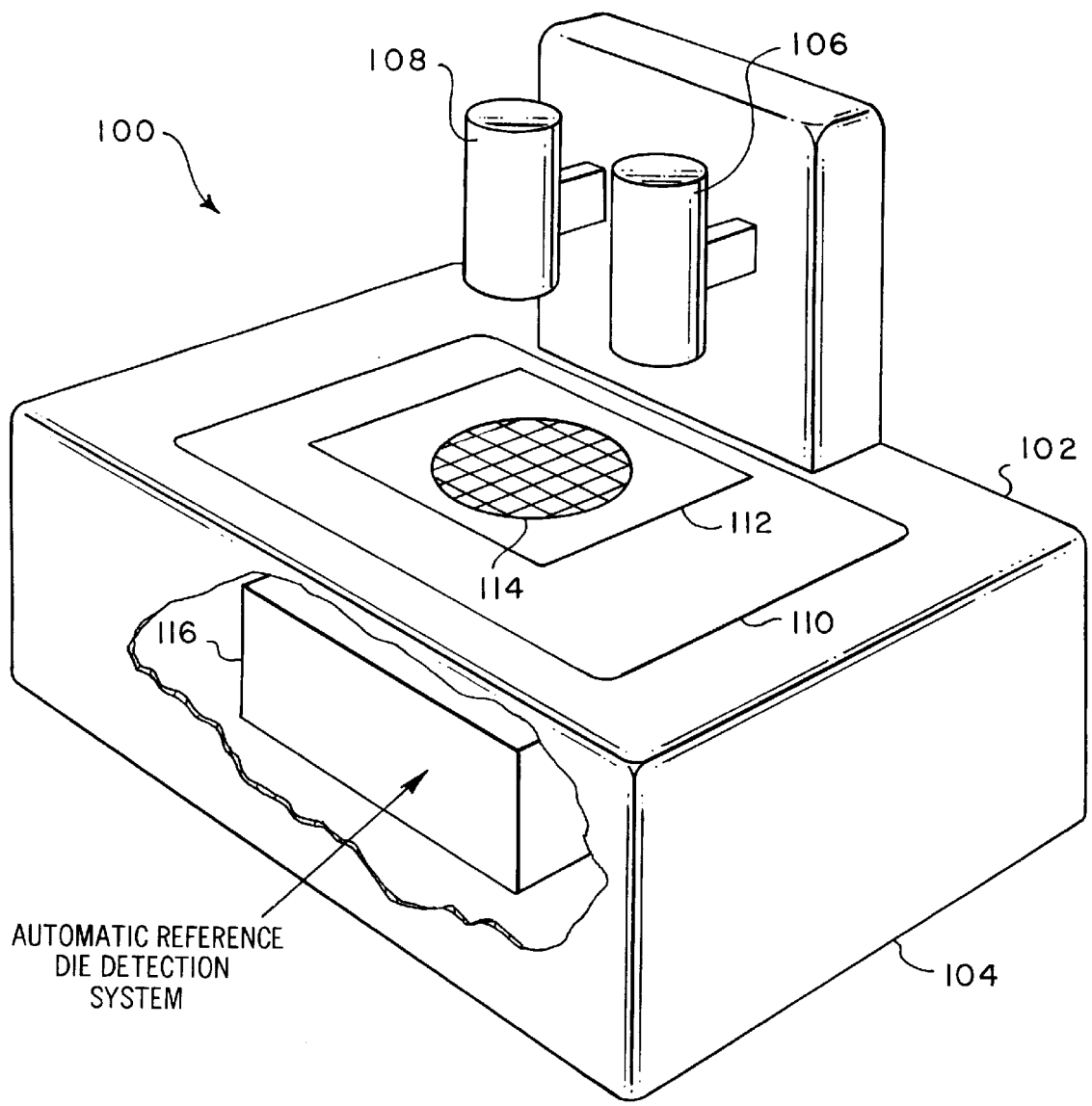
FIG. 1 is a diagram of a die test system in accordance with an exemplary embodiment of the present invention.

In the description which follows, like parts are marked throughout the specification and drawing with the same reference numerals, respectively. The drawing figures may not be to scale and certain components may be shown in generalized or schematic form and identified by commercial designations in the interest of clarity and conciseness.

FIG. 1 is a diagram of a die test system 100 in accordance with an exemplary embodiment of the present invention.

The die test system 100 may include, for example, software systems that operate on a WAV-1000 Automatic Visual Inspection System, manufactured by Semiconductor Technologies & Instruments, Inc., that is used for the inspection of semiconductor wafers, or other suitable programmable visual inspection systems.

The die test system 100 includes a die table 102, a controller 104, a camera 106, and a light source 108. A wafer handling system 110 of the die table 102 is operable to move a wafer support 112, which holds a silicon wafer 114. Typically, the silicon wafer 114 is formed into one or more dies prior to being placed on the wafer handling system 110.

The controller 104 is a programmable processor that may include a general purpose processing platform. For example, the controller 104 may include a Pentium processor or other suitable general purpose processor, and additional hardware or software such as an operating system, random access memory, video co-processors, field programmable gate arrays, or other suitable hardware or software. A reference die detection system 116 operates on controller 104 and may be implemented in hardware, software, or a suitable combination of hardware and software. The reference die detection system 116 is preferably a software application operating on the controller 104.

In operation, the die test system 100 is used to inspect dies formed from the silicon wafer 114, such as to detect dies having defects that may render the die unacceptable for use. The silicon wafer 114 is moved by the wafer handling system 110 so as to position each individual die within the fixed focal field of the camera 106. Images are capture by the camera 106 and are transferred to the controller 104. The light source 108 is used to maintain a controllable reference light, such that the image brightness data and other image data of each die of the silicon wafer 114 may be normalized so as to remain constant. In this manner, spurious identification of a good die as being imperfect or flawed as a result of lighting variations is minimized.

The die images obtained by the camera 106 are compared by software systems operating on the controller 104 to a reference die image, such that die images bearing defects may be detected. The reference die detection system 116 is used to form the reference image, such that operator handling and selection of reference dies is not required. The reference die detection system 116 generates data that is used by the controller 104 to cause the silicon wafer 114 to be moved in a predetermined manner, such that the individual dies of the silicon wafer 114 may be selected as reference dies. For example, the reference die detection system 116 may compare a first and second die of silicon wafer 114, and may then determine whether the first and second die contain defects.

If it is determined that the first and second die contain defects, then the reference die detection system 116 generates data that causes the controller 104 to advance the silicon wafer 114 to compare the third and fourth die of silicon wafer 114. The third and fourth die images are then compared to determine whether they contain any defects. This process is repeated until a sufficient number of dies from sufficient predetermined locations of the silicon wafer 114 have been selected to form a suitable reference image. Selection of images from various locations of silicon wafer 114 is preferable, so as to allow the die test system 100 to inspect each die of the silicon wafer 114 for defects without generating spurious rejections due to normal variations.

In this manner, the reference die detection system 116 may be used to perform reference die selection. The reference die detection system 116 thus eliminates the need for operators to manually select reference dies, which decreases the amount of time required for the processing of each silicon wafer 114, and also decreases the amount of operator involvement required to operate the die test system 100.

Figure 2:
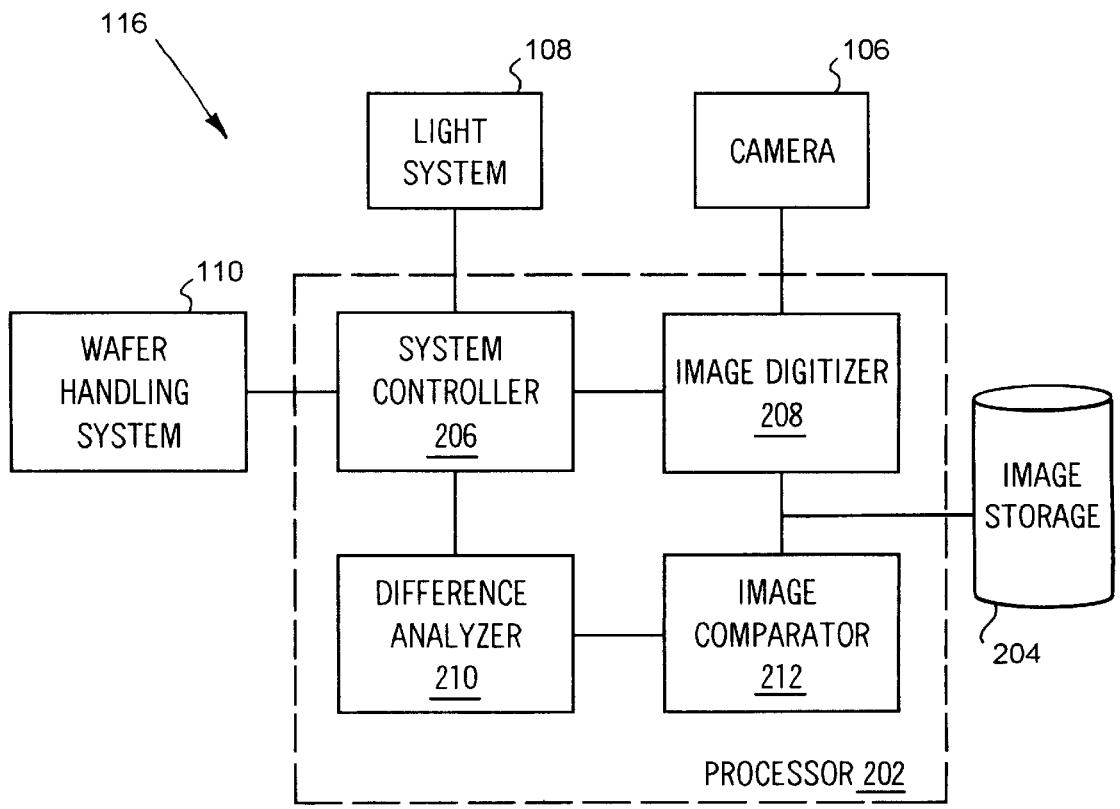
FIG. 2 is a block diagram of a reference die detection system in accordance with an exemplary embodiment of the present invention.

FIG. 2 is a block diagram of the reference die detection system 116 in accordance with an exemplary embodiment of the present invention. The reference die detection system 116 includes the light source 108, the camera 106, the wafer handling system 110, an image storage system 204, and a processor 202.

The processor 202 is a suitable processing platform for operating a software system, such as a Pentium processor or other suitable general purpose computing platform. The image storage system 204 includes a system controller 206, an image digitizer 208, a difference analyzer 210, and an image comparator 212, which may be implemented in hardware, software, or a suitable combination of hardware and software, but which are preferably software programs operating on the processor 202.

The system controller 206 is coupled to the wafer handling system 110, the light source 108, and the image digitizer 208. As used in this application, the term coupled means to form a physical connection (such as a data bus or a copper connection), a virtual connection (such as by reference to dynamically allocated memory locations in a random access memory), logical connections (such as through logic circuits of a processor or other logic device), or by other suitable mechanisms well known to those of ordinary skill in the art. The system controller 206 is operable to control the position of a die on the wafer handling system 110 in response to data received from the image digitizer 208. Likewise, the system controller 206 is operable to control the light source 108 based upon image data received from the image data digitizer 208. In this manner, the brightness and other image data of each die image may be normalized so that die images are not rejected as a result of lighting variations or other lighting conditions that do not directly affect die quality.

The image digitizer 208 is coupled to the camera 106, the image storage system 204, and the image comparator 212. The image digitizer 208 receives images generated by the camera 106 and converts the images into a digital image of the die of the silicon wafer 114 that is currently in the focal field of the camera 106. The image digitizer 208 is operable to determine the boundaries of each individual die so as to ensure that the die image is complete, and to record gray scale brightness data and other image data, such as color data, for the individual picture elements or pixels of the camera 106. The image digitizer 208 stores this data on the image storage device 204.

The image storage device 204 is a data storage medium, such as a random access memory, magnetic media, optical media, or other suitable date storage media. The image storage device 204 may be virtual memory locations within the processor 202 that are dynamically allocated by the processor 202. The image storage device 204 is coupled to the image digitizer 208 and the image comparator 212.

The image comparator 212 is coupled to the image digitizer 208, the image storage device 204, and the difference analyzer 210. The image comparator 212 is operable to receive digitized data for a first die image and a second die image, and to compare the two images on a pixel by pixel basis so as to generate a difference image. For example, if each of the pixels of the first die image and the second die image have identical values, then the image comparator 212 will return a difference image having pixel values of "0" for each pixel. Because the "0" pixel value typically corresponds to the most black shade, the image comparator 212 may also be configured to return pixel values having other suitable values when the difference between pixel values is zero, such as, for example, 255 in an 8 bit pixel system, 15 in a 4 bit pixel system, or other suitable values in a manner well known to those of ordinary skill in the art.

The difference analyzer 210 is coupled to the image comparator 212, and receives the difference image data generated by the image comparator 212. The difference analyzer 210 is operable to determine from the difference data whether the differences between the first die and the second die are indicative of defects, flaws, or other unacceptable conditions that would render one of the first die image or the second die image unacceptable for use as a reference die image. For example, the difference analyzer 210 may tabulate brightness data and other image data, and may determine from the brightness data and other image data whether unacceptable deviations exist between the brightness characteristics and other image characteristics of the first die image or the second die image. An unacceptable brightness or other image data variation may consist of a brightness or other image data difference that exceeds a predetermined magnitude, that occurs in excess of a predetermined frequency, that occurs in excess of a predetermined acceptable range for brightness and other image variations, or that exceeds other predetermined criteria. Likewise, the difference analyzer 210 may also or alternatively analyze the coordinates of the brightness data and other image data to determine the size, density, or other suitable characteristics of the brightness and the other image data anomalies. The difference analyzer 210 is also coupled to the system controller 206, and generates data for the system controller 206 that will cause the system controller 206 to advance the wafer handling system 110 to the next predetermined die location.

In operation, the reference die detection system 116 is used to select reference dies from a wafer for use with a die inspection system. The reference die detection system 116 uses predetermined criteria for determining whether variations in brightness and other image data for pixels of a first die image and a second die image will prevent either of the die images from being used as a reference die image. In this manner, the reference die detection system 116 may be used to select acceptable die images from a silicon wafer for use in forming the reference die image. Alternatively, the reference die detection system 116 may move to predetermined locations of the silicon wafer so as to select a suitable combination of die images from predetermined areas of the silicon wafer to form the reference image data.

Figure 3:
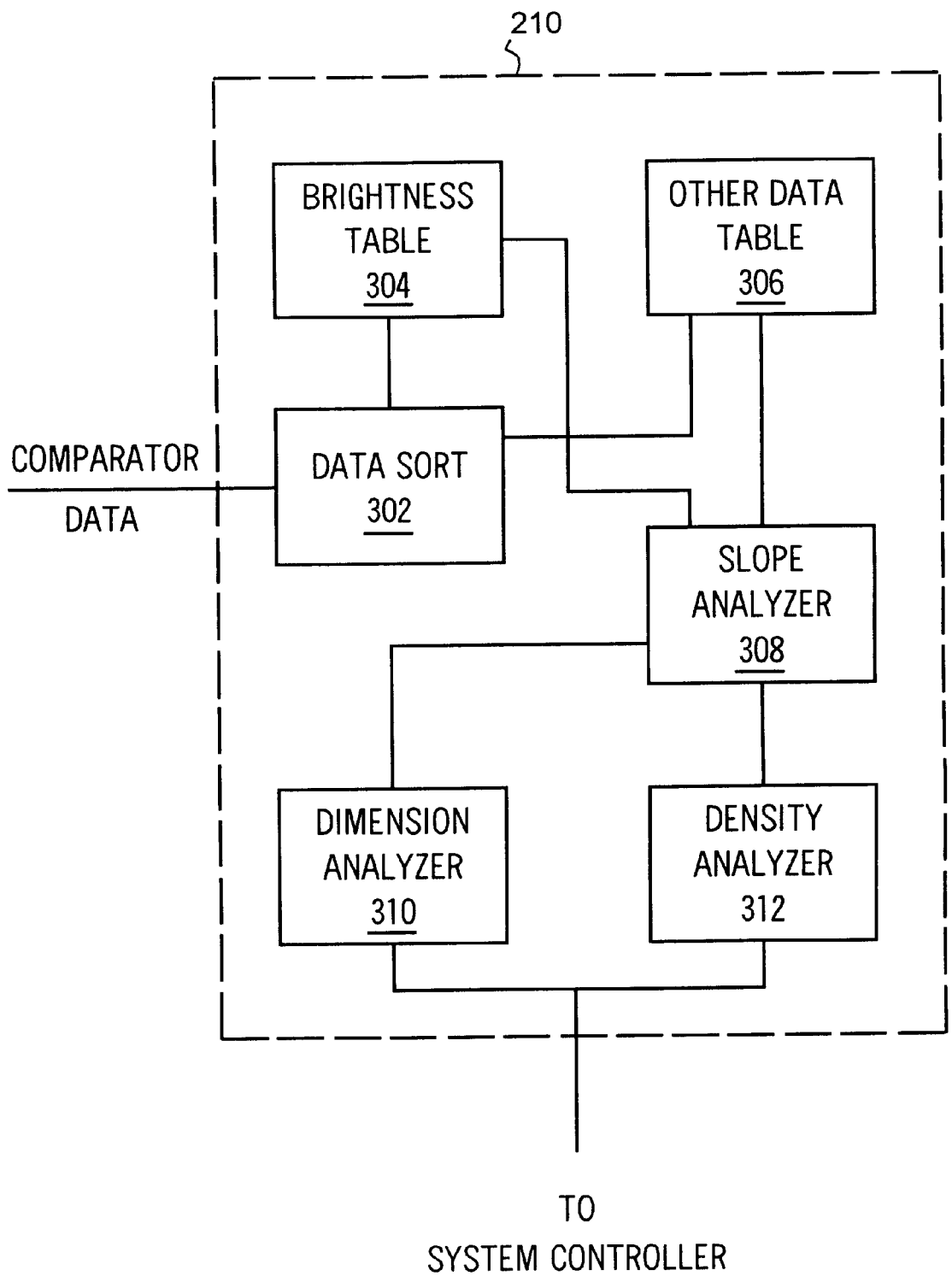
FIG. 3 is a block diagram of a difference analyzer in accordance with an exemplary embodiment of the present invention.

FIG. 3 is a block diagram of a difference analyzer 210 in accordance with an exemplary embodiment of the present invention. The difference analyzer 210 may be implemented in hardware, software, or a suitable combination of hardware and software, and is preferably operating code that operates on a general purpose processor of a visual inspection system.

The difference analyzer 210 includes a data sort system 302. The data sort system 302 may be implemented in hardware, software, or a suitable combination of hardware and software, and is preferably software that operates on a general purpose processor. The data sort system 302 receives image comparator data from a comparator system, such as the image comparator 212. The data sort system 302 stores the comparator data in a brightness table 304, an other data table 306, or other suitable table or tables depending on the type of data used. The data sort system 302 may also sort the brightness data and the other image data so as to tabulate the brightness magnitude and other data magnitude as a function of the frequency of occurrence of pixels having each brightness magnitude value and other data magnitude value.

The brightness table 304 may be implemented in hardware, software, or a suitable combination of hardware and software, and is preferably software that operates on a general purpose processor. The brightness table 304 contains gray scale brightness data from the difference image created by comparing the first die image and the second die image. For example, the brightness table 304 may contain a large amount of data representing the absolute value of the difference between individual pixels. In this exemplary embodiment, the brightness data and other image data for each pixel of the first die image and the second die image is compared, and the absolute magnitude of brightness difference and other image data difference is determined. The brightness table 304 thus would contain the brightness data for the difference image. For two identical die images, the brightness data will be zero which corresponds to black on a gray scale. On an 8 bit gray scale, 255 represents the brightest shade. Thus the brightness table 304 includes a tabulation of pixel element gray scale values, for example, ranging from 0 to 255 for an 8 bit gray scale image processing system.

The other image data table 306 may be implemented in hardware, software, or a suitable combination of hardware and software, and is preferably software that operates on a general purpose processor. The other image data table 306 contains image data, such as color data, for the difference image formed by comparing the first die image and the second die image. Other image data values may also be assigned on an 8 bit system, such that the other image data value ranges from 0 to 255. Therefore, for two identical images, having identical other image data values, the difference image will have values of zero. The other image data table 306 may also or alternatively contain a tabulation of all pixel element other image data values, for example, ranging from 0 to 255 for an 8 bit other image data image processing system.

The slope analyzer 308 may be implemented in hardware, software, or a suitable combination of hardware and software, and is preferably software that operates on a general purpose processor. The slope analyzer 308 is coupled to the brightness table 304 and the other image data table 306. The slope analyzer 308 is operable to determine the change in slope for increasing values of brightness data and other image data in the brightness table 304 and the other image data table 306, respectively. For example, as brightness increases from a value of 0 to a value of 255 in an 8 bit brightness gray scale system, the slope of the plot of frequency versus brightness should be negative over the entire range from 0 to 255. A change in the slope from negative to positive indicates the existence of area having a greater brightness than surrounding areas of the difference image. Bright areas of the difference image correspond to non-uniform areas from the first die image and second die image that are used to create the difference image. Thus, a change in slope from negative to positive may be indicative that either the first die image or the second die image should not be used as a reference die image. The slope analyzer 308 is used to determine whether such areas exist for either the brightness data in the brightness table 304 or the other image data in the other image data table 306.

The dimension analyzer 310 may be implemented in hardware, software, or a suitable combination of hardware and software, and is preferably software that operates on a general purpose processor. The dimension analyzer 310 is coupled to the slope analyzer 308. The dimension analyzer 310 is used to analyze the dimensions of areas having brightness or other image data values that are greater than expected. For example, if the slope analyzer 308 determines that brightness or other image data excursions exist, then the dimension analyzer 310 analyzes the coordinate data of the pixels that define the brightness and other image data excursions to determine the size of the potentially affected area. Predetermined criteria may be used to accept or reject areas having such brightness or other image data excursions. For example, it may be analytically or empirically determined that brightness and other image data excursions ranging in size from 0 to 1000 pixels and having major dimensions of less than 1 micron do not result in device operational defects having an unacceptable frequency of occurrence. In this manner, the dimension analyzer 310 may be calibrated to accept brightness or other image data defects having dimensions within a previously determined range and to reject brightness and other image data defects having dimensions outside of this range.

The density analyzer 312 may be implemented in hardware, software, or a suitable combination of hardware and software, and is preferably software that operates on a general purpose processor. The density analyzer 312 determines the density of areas that exceed acceptable brightness or other image data values by using the coordinate data of the pixels associated with such areas. If the absolute dimension of areas having brightness or other image data excursions is acceptable, there may still be an unacceptable density of such areas within a region of either the first die image or the second die image. The density analyzer 312 determines whether the number of brightness or other image data excursion areas exceeds predetermined acceptable levels. For example, in a 100 micron by 100 micron area, it may be determined that three brightness or other image data excursions having absolute dimensions of less than 1 micron by 1 micron are acceptable, but that any additional areas will result in an unacceptable probability of device misoperation. The density analyzer 312 is operable to determine the size and number of brightness and other image data excursion areas in regions of the difference image, and to determine whether the first die image and the second die image contain an unacceptable number of brightness or other image data excursion areas.

In operation, the difference analyzer 210 analyzes brightness and other image data created by comparing a first die image with a second die image to create a difference image. Difference analyzer 210 first determines whether there are any brightness or other image data excursions, based on a tabulation of the frequency of brightness data and other image data. If it is determined that brightness and other image data excursions exist, then the difference analyzer 210 determines whether the absolute size dimensions or density of such brightness and other image data excursion areas exceed predetermined allowable levels. A pass or fail response is then transmitted to the system controller to indicate whether to accept the first die image and second die image as reference images, or to reject both die images and select other die images.

Figure 4A:
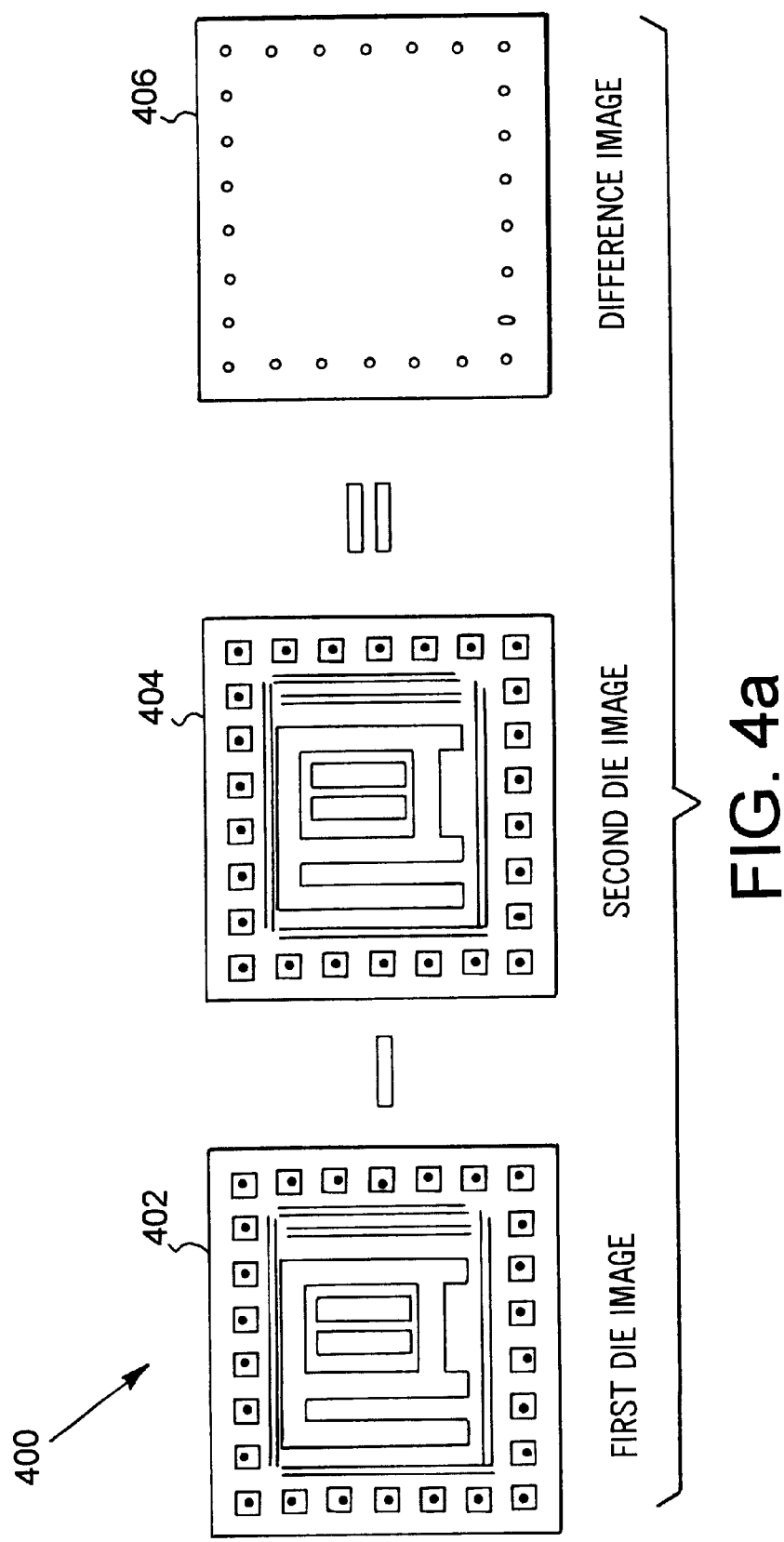
FIG. 4a is a diagram showing a first die image, a second die image, and the resulting difference image, such as would be created by an image comparator of the die detection system of FIG. 2.

FIG. 4a is a diagram showing a first die image 402, a second die image 404, and the resulting difference image 406 from a comparison of the first die image 402 and the second die image 404, such as would be created by the image comparator 212 of FIG. 2. Both the first die image 402 and the second die image 404 include bond pads (which are arranged around the periphery of the image) and semiconductor devices (which are included within the region defined by the bond pads). Each bond pad as shown further includes a probe mark. Probe mark variations between the first die image 402 and the second die image 404 result in the white circles surrounding the perimeter of the difference image 406. Likewise, edge variations of the devices contained within the first die image 402 and the second die image 404 result in the lighter areas contained within the difference image 406.

In operation, areas having known non-conformities, such as the probe marks of the bond pads of the first die image 402 and the second die image 404, may be removed to prevent misleading brightness or other image data variations. The remaining areas contained within the difference image 406 are then tabulated as a function of frequency and brightness absolute magnitude, or frequency and other image data absolute magnitude. In this manner, histogram data may be created that provides one measure by which the difference image 406 may be analyzed so as to determine whether the first die image 402 and second die image 404 may be used as reference die images.

Figure 4B:
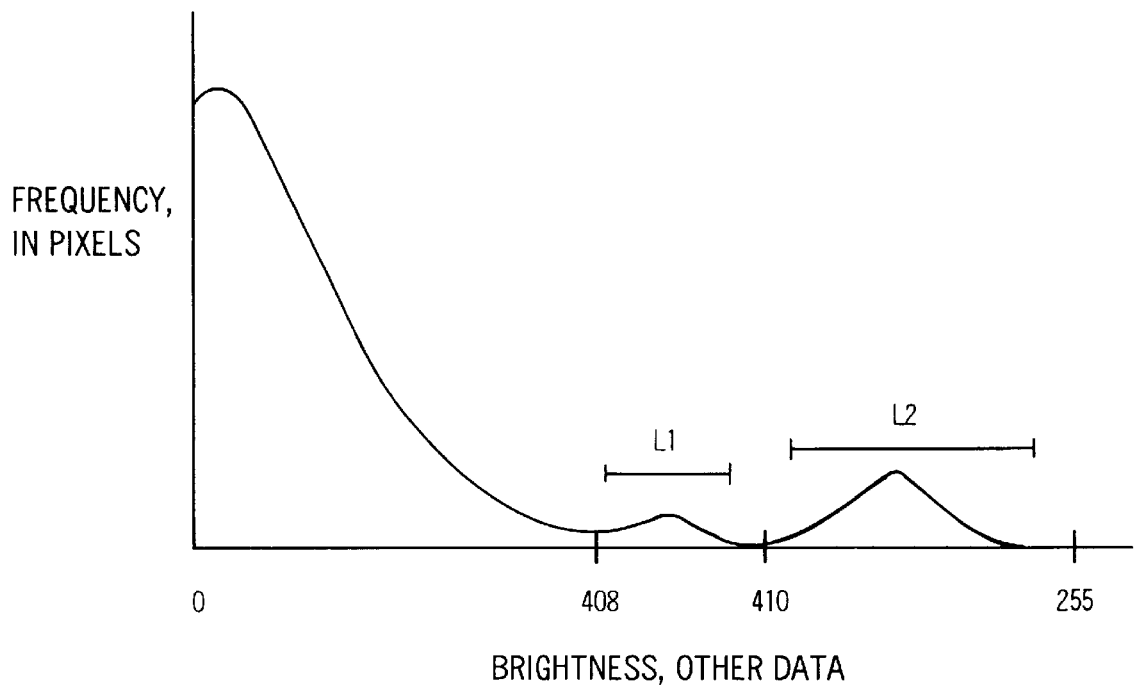
FIG. 4b is an example of a histogram showing the data variations, such as brightness variations, of the difference image as a function of frequency.

FIG. 4b is an example of a histogram showing the brightness variations or the other image data variations as a function of frequency. For die images that are similar, the brightness and/or other image data values having the greatest frequency will be closest to the zero value, because the difference image contains the absolute magnitude of the pixel differences for the first die image 402 and the second die image 404. As brightness and other image data absolute magnitude increase, the frequency drops off until point 408 is reached, at which point the brightness or other image data values start to increase. Point 408 marks the beginning of a first anomalous region having a length L1, after which the brightness and/or other image data values decrease back to a nominal level. The brightness and/or other image data values then begin to increase again starting at point 410, which marks the beginning of a second anomalous region having a length L2. The brightness and/or other image data values then decrease until the maximum brightness and/or other image data value of 255 is reached.

In operation, it may be analytically or empirically determined that brightness and/or other image data variation regions having a predetermined length, such as a length that exceeds L1, will result in dies with an unacceptable frequency of misoperation. Likewise, it may also be determined that the increase in the frequency of occurrence of brightness and/or other image data variations, or other suitable factors, is indicative of a potentially unacceptable frequency of misoperation of either the first die or the second die. The histogram of FIG. 4b is used to either identify such anomalous areas so as to accept or reject die images for use as a reference die image, or to identify areas requiring further analysis such as for anomaly dimension or anomaly density determination.

Figure 5:
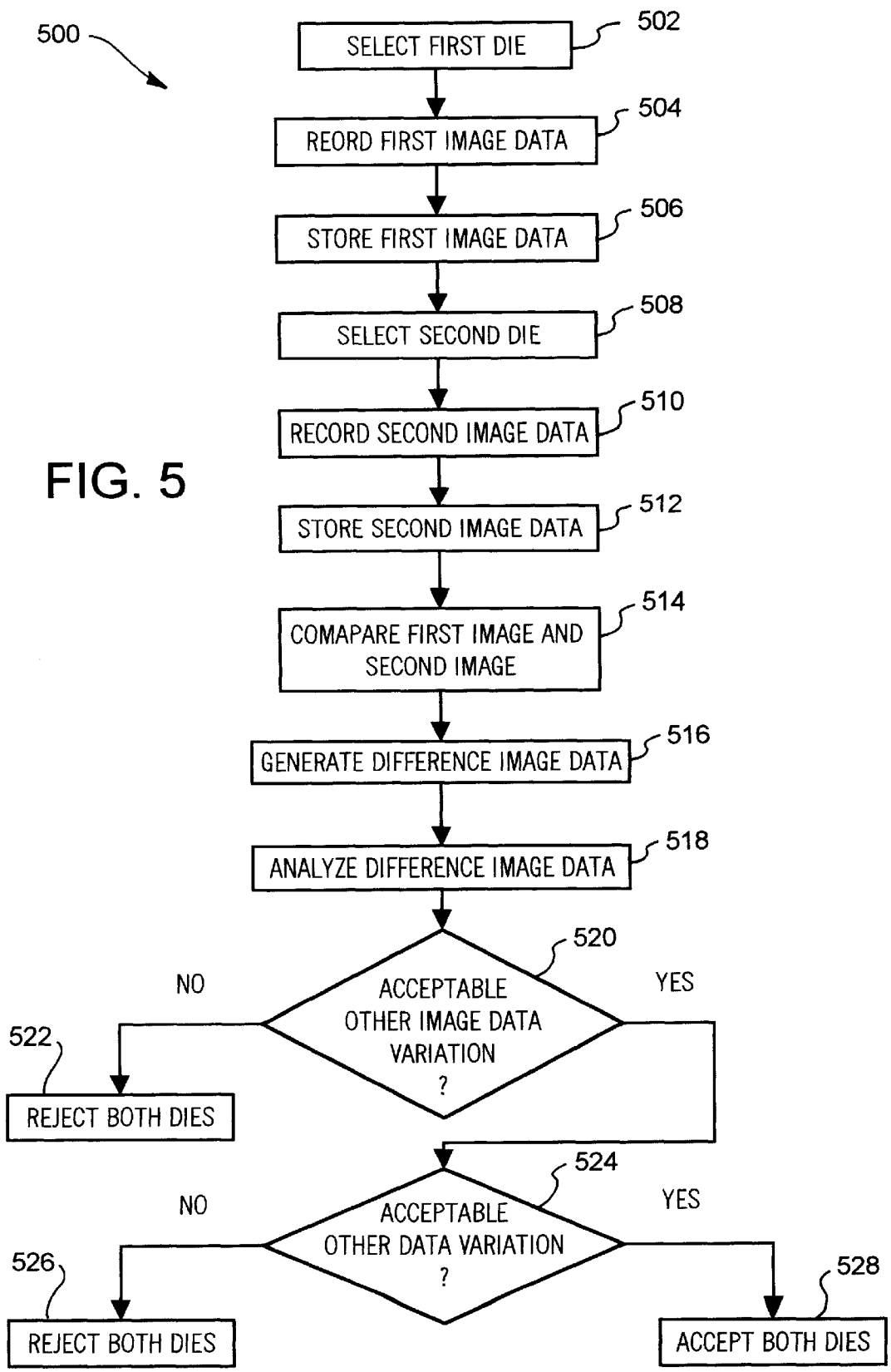
FIG. 5 is a flowchart of a method for selecting reference die images in accordance with an exemplary embodiment of the present invention.

FIG. 5 is a flowchart of a method 500 for selecting reference die images in accordance with an exemplary embodiment of the present invention. Method 500 may be used in a visual inspection system or in other suitable systems for selecting reference die images without requiring manual operator intervention.

Method 500 begins at step 502, where a first die is selected. For example, the number of dies that will be formed from a wafer may be predetermined, and the orientation of the wafer may be used to identify and select the first die. The orientation of all other dies of the wafer may then be known, such that the progression of die image testing may be predetermined. Other suitable systems and methods for selecting dies for analysis may also be used.

After the first die is selected at step 502, the first die image data is recorded at step 504. For example, a digital camera having a two dimensional field of 1,000×1,000 pixels may be used to record brightness data and/or other image data, such as 8 bit data ranging from a value of "0" for the darkest shade to a value of "255" for the brightest shade. This brightness data and/or other image data for the first image is stored at step 506. The method then proceeds to step 508, where a second die is selected. The image data for the second die is recorded at step 510, and is stored at step 512 in a suitable data storage device.

At step 514, the first die image and second die image are compared on a pixel-by-pixel basis. For example, the other image data for each pixel of the first die image may be subtracted from the other image data for each pixel of the second die image, such that the resulting difference image other image data magnitude is greater than zero when a difference in the other image data between the first die image and second die image exists. A similar process is used for the brightness data. The difference magnitude data is stored in a difference image data file at step 516.

The method then proceeds to step 518, where the difference image data is analyzed. For example, various measures may be analytically or empirically determined for accepting or rejecting dies based upon number of brightness and/or other image data variations, the magnitude of brightness and/or other image data variations, or other criteria. Likewise, certain other image data variations and/or brightness variations may require additional analysis, as they may fall within a range of potentially acceptable brightness or other image data variations.

The method then proceeds to step 520, where it is determined whether the other image data variations are acceptable. If the other image data variations are not acceptable, the method proceeds to step 522 and both dies are rejected. If the other image data variations are determined to be acceptable at step 520, the method proceeds to step 524 where it is determined whether the brightness variations are acceptable. If the brightness variations are determined to be not acceptable, then the method proceeds to step 526 and both dies are rejected. If it is determined at step 524 that brightness variations are acceptable, the method proceeds to step 528 and both dies are accepted for use as reference images.

In operation, method 500 is used to analyze die images from a silicon wafer so as to select die images for use in forming a reference image that may be used in subsequent visual inspection of the other dies formed from the same silicon wafer. Method 500 may be used to test predetermined dies so as to select dies for use in forming the reference image. For example, dies may be selected from locations around the periphery of a wafer, and locations within the center of a wafer, based on known variations and brightness and other image data. Method 500 allows a visual inspection system to select reference dies without requiring operator intervention or selection of reference dies, based upon known acceptable variations between dies. If the two dies selected for testing have brightness or other image data variations that exceed known acceptable levels, then both dies may be rejected for use as reference images, even though the dies may ultimately be determined to be acceptable for use, such as by passing subsequent visual inspection. Likewise, each die may be further tested against a third die, or other techniques may be used to select reference image dies.

Figure 6:
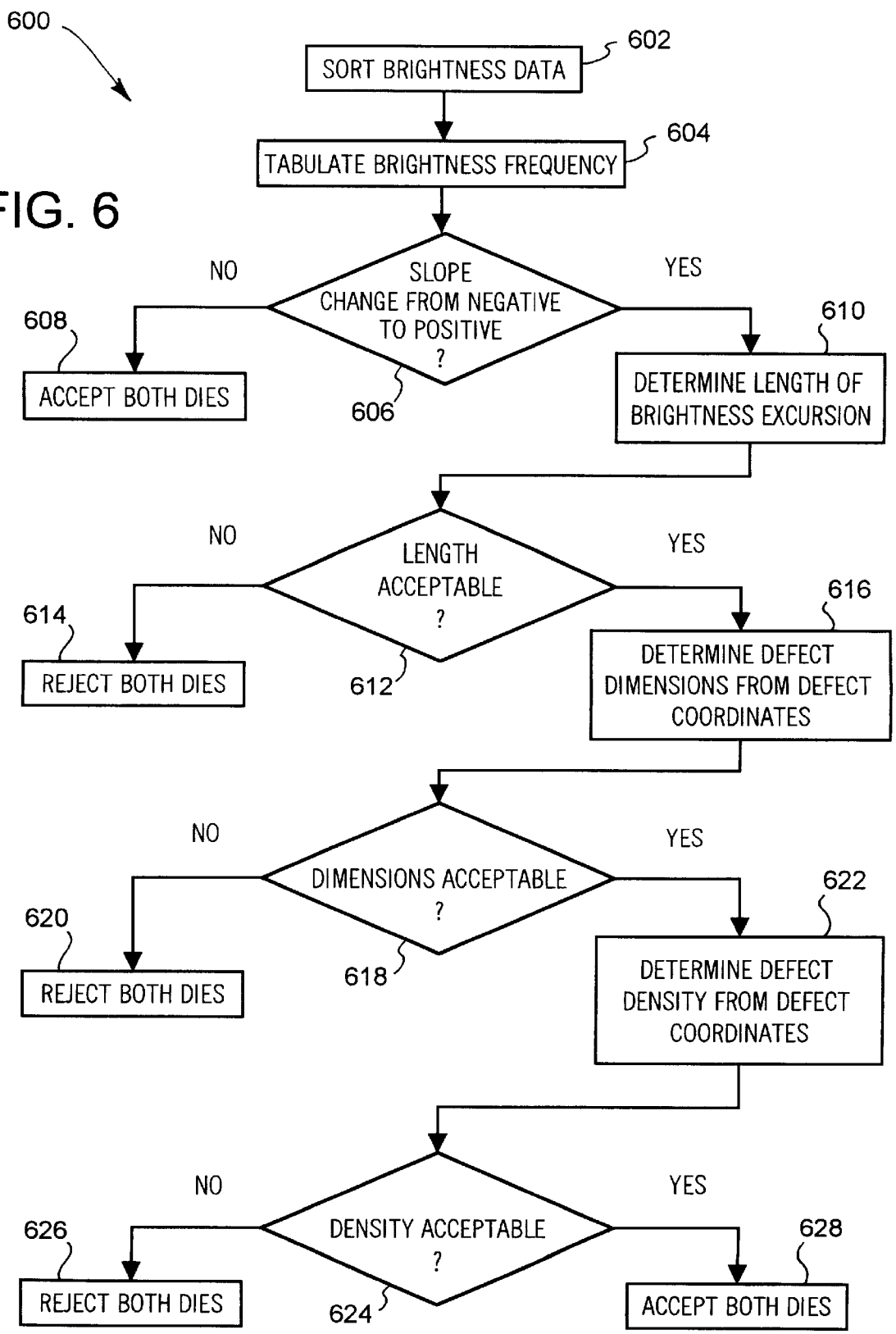
FIG. 6 is a flowchart of a method for analyzing brightness data in accordance with an exemplary embodiment of the present invention.

FIG. 6 is a flowchart of a method 600 for analyzing brightness data in accordance with an exemplary embodiment of the present invention. Method 600 may be used in conjunction with the difference analyzer 210 of FIG. 2 or with other suitable systems.

Method 600 begins at step 602, where brightness data from a difference image is sorted. The method then proceeds to step 604, where the brightness frequency is tabulated. For example, a frequency histogram of brightness magnitude may be created at step 604. The method then proceeds to step 606, where it is determined whether there is a slope change from negative to positive over the tabulated brightness frequency data. If no slope change from negative to positive occurs, the method proceeds to step 608 and both dies are accepted for use as reference dies. Otherwise, the method proceeds to step 610.

At step 610, the length of any brightness excursion that resulted in an increase in slope is determined. For example, the brightness excursion may extend over a range of gray scale brightness or other image data values. In an eight-bit system, for example, the gray scale values range from 0 to 255. In accordance with exemplary method 600, the length along the gray scale axis of the brightness excursion is determined at step 610. The method then proceeds to step 612 where it is determined whether the length is acceptable. For example, it may be analytically or empirically determined that a brightness excursion having a length that exceeds a predetermined number of points on a gray scale will result in devices that misoperate with an unacceptable frequency. If it is determined at step 612 that the length is unacceptable, the method proceeds to step 614 and both dies are rejected for use as reference images. If it is determined that the length of the brightness excursion is acceptable at step 612, the method proceeds to step 616.

At step 616, the defect dimensions from the pixel coordinates of the pixels that define the brightness excursion are determined. For example, a defect may be a line, a circle, a square, an irregular shape, or other shapes. The shape of such defects is determined at step 616, and the method proceeds to step 618. At step 618 it is determined whether the dimensions of the defect are acceptable. For example, it may be analytically or empirically determined that defects having a length and width that exceed a certain predetermined value, such as five microns, produce devices that have an unacceptable failure probability. If the dimensions are determined to be unacceptable at step 618, the method proceeds to step 620 and both die images are rejected for use as reference images. Otherwise, the method proceeds to step 622.

At step 622, the defect density is determined from the defect coordinates. For example, it may be determined analytically or empirically that a predetermined number of smaller defects within a larger area will result in a device that has an unacceptable failure probability. After the defect density is determined at step 622, the method proceeds to step 624 where it is determined whether the density of defects is acceptable. If the density of defects is not acceptable, the method proceeds to step 626 and both dies are rejected for use as reference images. Otherwise, the method proceeds to step 628 and both dies are accepted for use as reference images.

In operation, method 600 is used to analyze difference image data created by comparing a first die image and a second die image. The difference image is analyzed to determine whether to accept or reject both the first die and second die as potential reference images for subsequent visual inspection of dies formed from the wafer. Method 600 may be used in a system such as the difference analyzer 210 or in other suitable systems of visual inspection systems.

Method 600 uses predetermined analytically or empirically developed criteria for accepting or rejecting die images so as to select reference die images for subsequent visual inspection of other dies that have been formed from the silicon wafer. Accordingly, the sensitivity for allowable defects for such dies is typically set to a much higher threshold than the allowable sensitivity for defects for variations between the reference die image and individual dies tested on the wafer. Thus, even though differences between two dies may result in the die images being rejected for the purpose of use as a reference die, each die may subsequently be determined to be acceptable for use in production.

FIG. 7 is a flowchart of a method 700 for analyzing other image data in accordance with an exemplary embodiment of the present invention. Method 700 may be used in conjunction with the difference analyzer 210 of FIG. 2 or with other suitable systems, and uses image data other than brightness that may be used to perform inspection of dies. For example, infrared light, ultraviolet light, or light of predetermined color may be used to detect defects or flaws that may not be detected as well by simple brightness variations.

Method 700 begins at step 702, where image data from a difference image is sorted. The method then proceeds to step 704, where the image data frequency is tabulated. For example, a frequency histogram of image data magnitude may be created at step 704. The method then proceeds to step 706, where it is determined whether there is a slope change from negative to positive over the tabulated image data frequency data. If no slope change from negative to positive occurs, the method proceeds to step 708 and both dies are accepted for use as reference dies. Otherwise, the method proceeds to step 710.

At step 710, the length of any image data excursion that resulted in an increase in slope is determined. For example, the image data excursion may extend over a range of image data values. In an eight-bit system, for example, the image data values would range from 0 to 255. In accordance with the exemplary method 700, the length along the axis of the image data excursion is determined at step 710. The method then proceeds to step 712 where it is determined whether the length is acceptable. For example, it may be analytically or empirically determined that an excursion for the image data being used that has a length that exceeds a predetermined number of points on the image data scale will result in devices that misoperate with an unacceptable frequency. If it is determined at step 712 that the length is unacceptable, the method proceeds to step 714 and both dies are rejected for use as reference images. If it is determined that the length of the image data excursion is acceptable at step 712, the method proceeds to step 716.

At step 716, the defect dimensions from the pixel coordinates of the pixels that define the image data excursion are determined. For example, a defect may be a line, a circle, a square, an irregular shape, or another shape. The shape of such defects is determined at step 716, and the method proceeds to step 718. At step 718 it is determined whether the dimensions of the defect are acceptable. For example, it may be analytically or empirically determined that defects having a length and width that exceed a certain predetermined value, such as five microns, produce devices that have an unacceptable failure probability. If the dimensions are determined to be unacceptable at step 718, the method proceeds to step 720 and both die images are rejected for use as reference images. Otherwise, the method proceeds to step 722.

At step 722, the defect density is determined from the defect coordinates. For example, it may be analytically or empirically determined that a predetermined number of smaller defects within a larger area will result in a device that has an unacceptable failure probability. After the defect density is determined at step 722, the method proceeds to step 724 where it is determined whether the density of defects is acceptable. If the density of defects is not acceptable, the method proceeds to step 726 and both dies are rejected for use as reference images. Otherwise, the method proceeds to step 728 and both dies are accepted for use as reference images.

In operation, method 700 is used to analyze difference image data created by comparing a first die image and a second die image. The difference image is analyzed to determine whether to accept or reject both the first die and second die as potential reference images for subsequent visual inspection of dies formed from the wafer. Method 700 may be used in a system such as the difference analyzer 210 or in other suitable systems of visual inspection systems.

Method 700 uses predetermined analytically or empirically developed criteria for accepting or rejecting die images so as to select reference die images for subsequent visual inspection of other dies that have been formed from the silicon wafer. Accordingly, the sensitivity for allowable defects for such dies is typically set to a much higher threshold than the allowable sensitivity for defects for variations between the reference die image and individual dies tested on the wafer. Thus, even though differences between two dies may result in the die images being rejected for the purpose of use as a reference die, each die may subsequently be determined to be acceptable for use in production.

Although preferred and exemplary embodiments of reference die selection systems and methods for selecting reference dies have been described in detail herein, those skilled in the art will also recognize that various substitutions and modifications may be made to the systems and methods without departing from the scope and spirit of the appended claims.

What is claimed is:

1. A system for selection of a reference die image comprising:

a die image comparator operable to create a difference image based upon a first die image and a second die image; and a difference image analysis system coupled to the die image comparator, the difference image analysis system generating histogram data from the difference image and analyzing the slope of the histogram data to determine the length of a region over which the slope of the histogram data increases and then decreases, wherein the length of the anomalous region is then used to determine whether the first die image and the second die image may each be used as the reference die image for subsequent comparison with other dies on a wafer.

2. The system of claim 1 further comprising a die imaging system coupled to the die image comparator, the die imaging system operable to create a digital representation of a die.

3. The system of claim 1 further comprising a die image storage system coupled to the die image comparator, the die image storage system operable to store data representative of the first die image and the second die image.

4. The system of claim 1 wherein the difference image analysis system further comprises a slope detector, the slope detector operable to determine whether the slope of a histogram changes from negative to positive.

5. The system of claim 1 wherein the difference image analysis system further comprises a size detector, the size detector operable to determine whether a size of the anomalous region exceeds a predetermined allowable size.

6. The system of claim 1 wherein the difference image analysis system further comprises a density detector, the density detector operable to determine whether a number of anomalous regions per unit area exceeds a predetermined allowable number of anomalous regions per unit area.

7. A system for inspecting dies comprising:
   a camera configured to obtain an image of two or more dies; and
   a reference die detection system coupled to the camera, the reference die detection system operable to analyze slope changes in histogram data a difference between a first die image and a second die image to determine the length of a region over which the slope of the histogram data increases and then decreases, wherein the length of the anomalous region is then used to determine whether the first die image and the second die image can be used as reference images for subsequent comparison with other dies on a wafer.

8. The system of claim 7 wherein the reference die detection system further comprises an image comparator operable to produce a difference image from the first die image and the second die image.

9. The system of claim 8 wherein the reference die detection system further comprises a difference analyzer coupled to the image comparator, the difference analyzer operable to determine whether the difference image contains unacceptable features.

10. The system of claim 9 wherein the difference analyzer further comprises a data sorter that is operable to receive brightness data associated with a plurality of pixels of the difference image and to create a histogram from the brightness data.

11. The system of claim 10 wherein the difference analyzer further comprises a slope detector coupled to the data sorter, the slope detector operable to determine whether a slope of the brightness data histogram changes from negative to positive as a brightness magnitude increases.

12. The system of claim 10 wherein the difference analyzer further comprises a dimension analyzer that is operable to determine (a) one or more dimensions for a group of pixels, where each pixel has a brightness magnitude that exceeds a predetermined allowable magnitude, and (b) whether one or more dimensions of the group of pixels exceeds one or more predetermined allowable dimensions.

13. The system of claim 10 wherein the difference analyzer further comprises a density analyzer that is operable to determine (a) one or more dimensions of two or more groups of pixels, where each group of pixels has a brightness magnitude that exceeds a predetermined allowable magnitude, and (b) whether a density of the two or more groups of pixels per unit area exceeds a predetermined allowable density.

14. The system of claim 9 wherein the difference analyzer further comprises a data sorter that is operable to receive image data associated with a plurality of pixels of the difference image and to create a histogram from the image data.

15. The system of claim 14 wherein the difference analyzer further comprises a slope detector coupled to the data sorter, the slope detector operable to determine whether a slope of the image data histogram changes from negative to positive as an image data magnitude increases.

16. The system of claim 14 wherein the difference analyzer further comprises a dimension analyzer that is operable to determine (a) one or more dimensions of a group of pixels, where each group of pixels has an image data magnitude that exceeds a predetermined allowable magnitude, and (b) whether the dimensions of the group of pixels per unit area exceeds one or more predetermined allowable dimensions.

17. The system of claim 14 wherein the difference analyzer further comprises a density analyzer that is operable to determine (a) one or more dimensions of two or more groups of pixels, where each group of pixels has an image data magnitude that exceeds a predetermined allowable magnitude, and (b) whether a density of the two or more groups of pixels per unit area exceeds a predetermined allowable density.

18. A method for selecting a reference die image comprising:
   subtracting a first die image from a second die image to create a difference image;
   generating histogram data from the difference image;
   determining the length of a region over which a slope of the histogram data increases and then decreases;
   determining whether the difference image contains unacceptable data based on whether the length of the region exceeds predetermined allowable criteria; and determining whether the first die image and the second die image can be used as reference images for subsequent comparison with other dies on the wafer.

19. The method of claim 18 wherein subtracting the first die image from the second die image comprises subtracting brightness data for each pixel of the first die image from brightness data for a corresponding pixel of the second die image.

20. The method of claim 18 wherein subtracting the first die image from the second die image comprises subtracting image data other than brightness data for each pixel of the first die image from image data other than brightness data for a corresponding pixel of the second die image.

21. The method of claim 18 wherein determining whether the difference image contains unacceptable data comprises:
   forming a histogram from difference image data; and
   determining whether a slope of the histogram changes from negative to positive.

22. The method of claim 18 wherein determining whether the difference image contains unacceptable data comprises determining whether a size of an area having a brightness deviation exceeds a predetermined allowable size.

23. The method of claim 18 wherein determining whether the difference image contains unacceptable data comprises determining whether a size of an area having an image data deviation for image data other than brightness data that exceeds a predetermined allowable size.

24. The method of claim 18 wherein determining whether the difference image contains unacceptable data comprises determining whether a number of areas having brightness deviations exceeds a predetermined allowable number of areas having brightness deviations per unit area.

25. The method of claim 18 wherein determining whether the difference image contains unacceptable data comprises determining whether a number of areas having other image data deviations exceeds a predetermined allowable number of areas having image data deviations per unit area for image data other than brightness data.

26. The method of claim 18 further comprising:

selecting two or more difference images that do not contain unacceptable data, where each difference image is selected from a different predetermined region of the silicon wafer; and combining the die images used to create the two or more difference images to form a reference image for use in comparing with each die of the silicon wafer.

* * * * *

UNITED STATES PATENT AND TRADEMARK OFFICE
CERTIFICATE OF CORRECTION

PATENT NO. : 6,252,981 B1
DATED : June 26, 2001
INVENTOR(S) : Guest et al.

Page 1 of 1

It is certified that error appears in the above-identified patent and that said Letters Patent is hereby corrected as shown below:

Column 13,
Line 19, before "a difference between", insert -- derived from --.

Signed and Sealed this

Twenty-fifth Day of December, 2001

Attest:

Attesting Officer

JAMES E. ROGAN
Director of the United States Patent and Trademark Office